United States Patent [19]

Gerot et al.

[11] Patent Number: 5,373,258
[45] Date of Patent: Dec. 13, 1994

[54] METHOD AND APPARATUS FOR SLAVING THE FREQUENCY AND PHASE OF AN OSCILLATOR TO A REFERENCE SIGNAL

[75] Inventors: Guy Gerot, Saint Nom La Breteche; Pascal Blouin, Lassy, both of France

[73] Assignee: SGS-Thomson Microelectronics S.A., Gentilly, France

[21] Appl. No.: 75,821

[22] Filed: Jun. 11, 1993

[30] Foreign Application Priority Data

Jun. 11, 1992 [FR] France ................................ 92 07059

[51] Int. Cl.[5] ............................................ H03L 7/085
[52] U.S. Cl. ...................................... 331/14; 331/17; 331/25
[58] Field of Search ...................... 331/1 A, 14, 17, 25; 375/120

[56] References Cited

U.S. PATENT DOCUMENTS

| 4,744,096 | 5/1988 | Roux | 375/120 |
| 5,216,554 | 6/1993 | Schneider | 331/1 A X |

FOREIGN PATENT DOCUMENTS

| 0230900 | 8/1987 | European Pat. Off. . |
| 0467306 | 1/1992 | European Pat. Off. . |
| 2246036 | 1/1992 | United Kingdom . |

*Primary Examiner*—Siegfried H. Grimm
*Attorney, Agent, or Firm*—Wolf, Greenfield & Sacks

[57] ABSTRACT

In the slaving process, a reference signal is sampled by a clock signal of an oscillator and then digitized. The value representative of a phase error is then deduced from the sampled and digitized signal. A correction value is then deduced from this phase error to correct a digital value representing the oscillator control voltage. The device of the invention allows this process to be implemented. The invention also relates to a voltage-controlled crystal oscillator incorporating such a device.

15 Claims, 2 Drawing Sheets

METHOD AND APPARATUS FOR SLAVING THE FREQUENCY AND PHASE OF AN OSCILLATOR TO A REFERENCE SIGNAL

BACKGROUND OF THE INVENTION

1. Field of the Invention

This invention relates to a process and device for slaving the frequency and phase of an oscillator, specifically a voltage-controlled crystal oscillator. More particularly, the process and device of the invention include slaving the operation of a crystal oscillator against an external signal provided in the form of periodic bursts.

2. Discussion of the Related Art

Voltage-controlled crystal oscillators have been known for a long time. Notably, French patent number FR-1.473.273 teaches a crystal oscillator whose operating frequency is controlled according to an electric control signal, such as a voltage level, whose variations produce almost linear variations in the oscillator's operating frequency. Crystal oscillator circuits of this kind have also been described more recently in French and European patent applications numbers FR-2.569.505 and BP-466.388 respectively.

Devices for slaving the frequency and phase of a crystal-controlled oscillator against a reference signal have also been known for a long time. For example, French patent application number FR-2.620.878, filed in the name of THOMSON-CSF, proposes a crystal oscillator whose operating frequency is thermally controlled. A mechanism is provided in particular to heat the crystal which, according to a measured frequency and phase difference, modifies the temperature of the crystal and therefore its operating frequency. Other temperature-controlled crystal oscillators are also described in European patent application number EP-401.919.

Special control loops for locking short-term stable oscillation against long-term stable oscillation are also known and taught in French patent applications numbers FR-2.626.686 and FR-2.614.116. Such control loops are used, for example, in the telecommunications field to match working frequencies with atomic standard frequencies.

European patent application number EP-0.230.900 describes a device for rhythms recovery. In one embodiment, the signal is sampled and digitized. The sign of the signal, being related to the estimated error, is then determined and directed to a sequential logic. This logic produces, through an analogic logical interface, a command signal for the sampler. In this device, solely the sign of the estimated error is considered.

The present invention proposes a process and device for slaving the frequency and phase of an oscillator, particularly a voltage-controlled crystal oscillator, which is novel and includes the advantage that it allows the control loop of the crystal oscillator to be processed mainly in digital fashion.

An object of this invention is to provide a process for slaving the frequency and phase of a crystal oscillator against a reference signal, the crystal oscillator being controlled in frequency and phase by a physical control magnitude.

SUMMARY OF THE INVENTION

The present invention provides a process for slaving the frequency and phase of a crystal oscillator against a reference signal wherein:

the reference signal is a random signal of several levels, of given frequency and phase, the reference signal being sequenced, the phase error between the oscillator and the reference signal is determined for at least one reference signal sequence, and a correction signal is generated to correct the physical control magnitude according to this phase error, and wherein it includes the following succession of stages:

the reference signal is sampled by a clock signal sent by the oscillator, the sampled signal thus obtained is digitized, a value representative of the phase error of the signal synthesized by the oscillator relative to the reference signal is then deduced for one sequence of the said digitized signal, a correction value is then deduced from this digital value representative of the phase error and used to correct a digital value representing the control magnitude, this digital value representing the control magnitude is then converted into the physical magnitude, and this physical magnitude is applied to the oscillator to control its frequency and phase.

This process can be advantageously carried out according to one or more of the following:

the correction value used to correct the digital value representing the control magnitude is calculated according to the size of the phase error and its variation from one signal sequence to the next:

the physical magnitude controlling the oscillator is a voltage;

to calculate a value representative of the phase error, sample signal values are determined corresponding to transitions between different thresholds for the sampled signal, a mean of the sample values determined is then calculated;

to calculate a value representative of the phase error, the difference between a mean sample value corresponding to increasing transitions and a mean sample value corresponding to decreasing transitions is then calculated;

the sequencing frequency of the reference signal is chosen so that on average, an equivalent number of increasing transitions and decreasing transitions are detected on a sequence;

to calculate the correction value, the last two values obtained representative of the phase error are compared, and if the phase error is found to be increasing and positive, a positive correction value is generated that is proportional to the difference between the values representative of a phase error;

if the phase error is found to be increasing and negative, a correction value is generated that is proportional to the difference between the values representative of the phase error;

if the phase error is found to be constant and strictly positive, an elementary positive correction value is generated;

if the phase error is found to be constant and strictly negative, an elementary negative correction value is generated;

a dead zone is determined before the process is begun, the dead zone corresponding to values representative of the phase error for which the control loop is not activated.

In another embodiment of the present invention the crystal oscillator is controlled in frequency and phase by a physical magnitude, including an analogue-to-digital converter to sample the reference signal by a sampling signal generated by the clock of the oscillator, a circuit for digitally calculating values representative of the phase error, a circuit for calculating a correction value according to these different calculated values representative of phase errors, of a value representative of the magnitude controlling the oscillator, a digital-to-analogue integrator to transform this corrected value into the control magnitude, and to apply the control magnitude to the input of the oscillator.

Advantageously, for calculating a value representative of phase errors, the invention includes a circuit for detecting levels and transitions to which the sampled signals are provided, in addition to means forming memory registers for the samples, the circuit for detecting levels and transitions sending selection orders to the means forming registers for the samples corresponding to transitions for the sampled signal, the mean of the values of the samples thus selected then being calculated to provide a value representative of the phase error.

Preferably, the circuit forming the transition detectors are, first, means forming increasing transition detectors and secondly, means forming decreasing transition detectors, with the determining means providing the mean value of increasing transitions and the mean value of decreasing transitions and, by subtraction, the difference between these two mean values.

BRIEF DESCRIPTION OF THE DRAWINGS

The following description of a particular embodiment of the invention is purely illustrative and non-limiting. It must be read in conjunction with the attached drawings. In these drawings.

DETAILED DESCRIPTION

Figure 1:
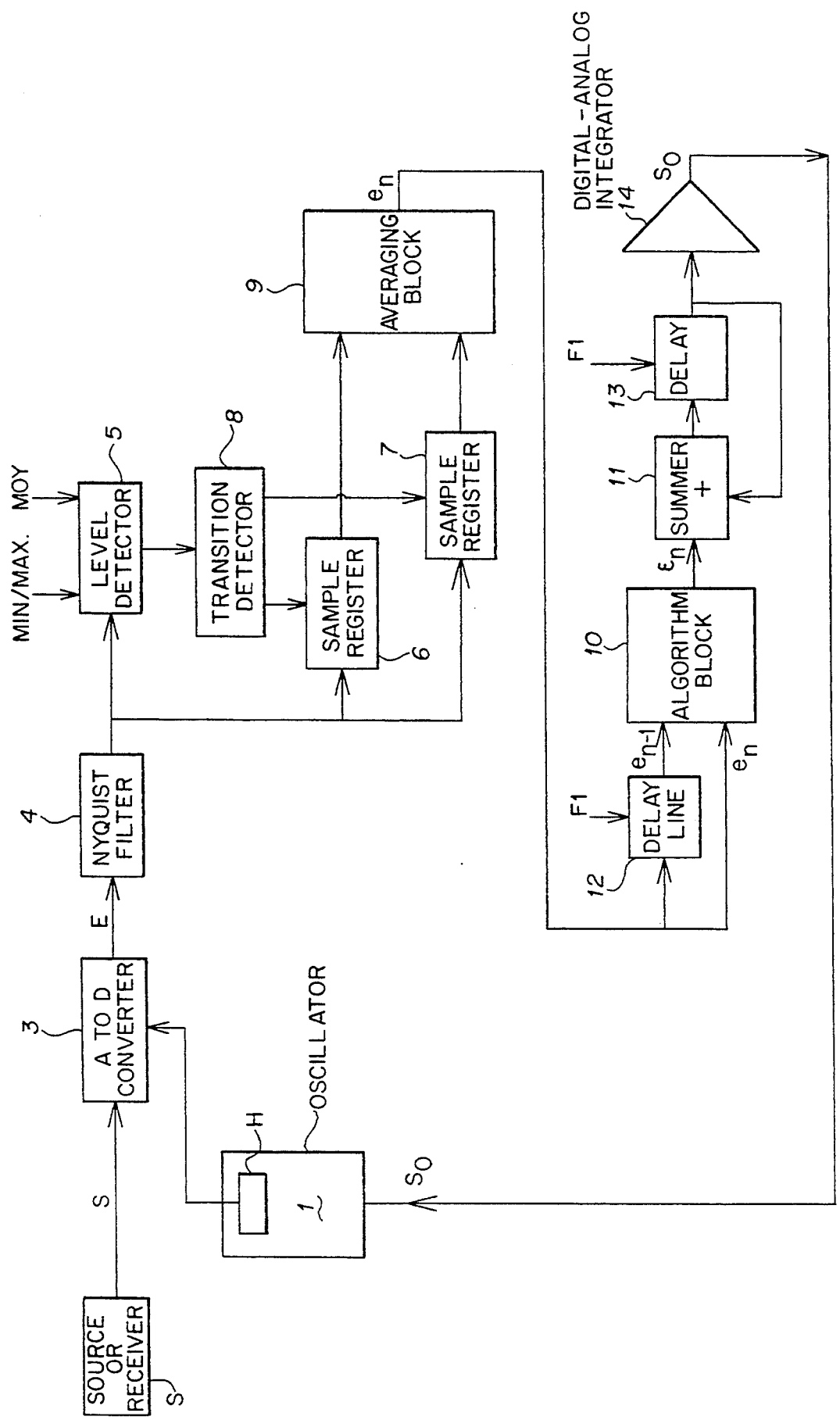
FIG. 1 is a block diagram illustrating the process and device in accordance with the present invention for slaving an oscillator.

As can be seen in FIG. 1, the device for slaving a voltage-controlled crystal oscillator 1 comprises principally an analogue-to-digital converter 3 which receives, first, a sampling signal sent to it by clock H of oscillator 1, and secondly, a reference signal transmitted to it by a source or a receiver S. This reference signal, termed signal S throughout this specification, is a random signal of several levels, for example duobinary. The signal at the output of this analogue-to-digital converter 3 is a sampled, digitized signal E.

The digital signal at the output of this converter 3 is sent to a Nyquist filter 4 which, in certain specific applications, allows the working pass bands to be selected.

The digital signal is next sent, first, to a level detector 5, and secondly, to two sample memory registers 6 and 7. The level detector 5 is a threshold detector parametered with a mean value Moy and maximum and minimum values Max and Min. Level detector 5 is coupled to a transition detector 8 which sends a selection order to sample register 6 on ascending transitions, and to sample register 7 on descending transitions.

The device of the invention is particularly suitable to television signal processing, such as those resulting from D2HAC normalization. It is known that these signals include reference sequences making it possible to measure its values, which can vary between a minimum level denoted as black level, and a maximum level denoted as white level.

The maximum and minimum values involved in the process of the invention correspond to these black and white levels.

At the output of registers 6 and 7, the samples corresponding respectively to the ascending transitions and descending transitions detected are sent to an averaging block 9. This averaging block 9 provides, according to an initially selected sequencing frequency, a value corresponding to a mean value representative of the phase error of the analyzed signal sequence.

The mean phase error value $e_n$ of the $n^{th}$ signal sequence is then sent to an algorithm block which calculates a correction value $\epsilon_n$ according to the value $e_n$ and the value $e_{n-1}$ of the n-1th signal sequence stored at the level of a delay line 12. This correction value $\epsilon_n$ is then summed by a conventional summing 11 and delay 13 loop, with the output value of this loop obtained by the preceding signal sequence.

The summed value thus obtained is provided to a digital-analogue integrator 14 which transforms it into a voltage which is applied to the oscillator in order to control its phase and frequency. The operation of this device will be described in greater detail below.

Figure 2A:
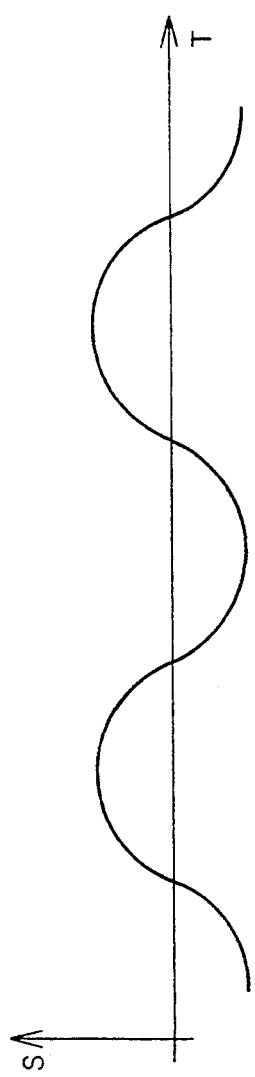
FIGS. 2a and 2b show respectively, the reference signal which allows the slaving of the oscillator to be achieved, and a sampling signal supplied by the clock of the oscillator.
Figure 2B:
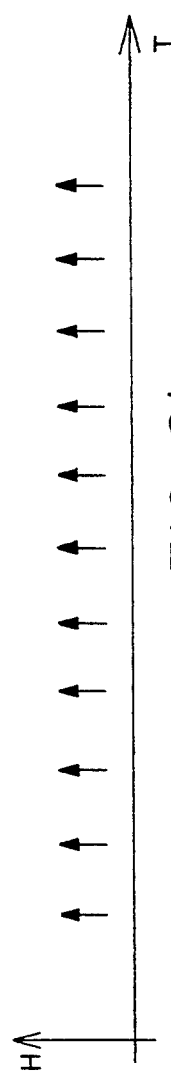
Figure 2C:
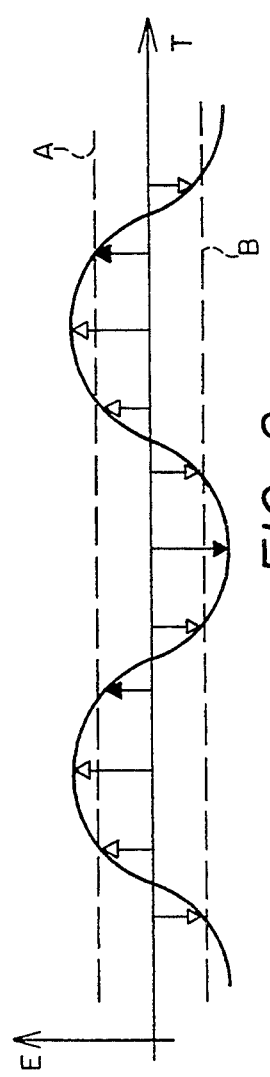
FIG. 2c diagrammatically illustrates the manner in which the phase error between the oscillator and reference signal is calculated.

Signal S, shown in FIG. 2a, serves as the reference signal and is chosen for the sake of this example to be sinusoidal. It is sampled at the level of the analogue-to-digital converter 3 by the clock H signal shown in FIG. 2b. The thus sampled and digitized signal E, corresponding to the arrows shown in FIG. 2c, is then sent to detectors 5 and 8 where signal levels are first detected and then transitions identified. FIG. 2c shows, for the purposes of an example, two detection levels A and B, a transition being detected whenever the sampled values pass from above to below such a level, or inversely. For example, the arrows with darkened heads shown in FIG. 2c are the samples corresponding to descending transitions detected and therefore to the values sent to register 7.

The averaging block 9, for a given sequence, calculates the sum of ascending transitions and the sum of descending transitions, and then subtracts one sum from another and divides the result by the number of transitions detected in the sequence. The sequencing frequency F1 is initially chosen in such a way that in principle one sequence comprises an average of eight ascending transitions and eight descending transitions. This frequency F1 is applied to delay blocks 12 and 13. The value $e_n$ thus obtained is a mean value of reference signals, significant of the phase error and free of any possible error which could have been made on the position of the mean value at the level of threshold detector 5, i.e., of the zero in the case of a sinusoidal signal.

This phase error $e_n$ is then compared in the algorithm block 10 with the error $e_{n-1}$ on the preceding current line (or signal sequence):

if the phase error is increasing and positive from one line to the next, the frequency of the signal synthesized by crystal oscillator 1 is lower than the frequency of the reference signal or nominal frequency. A positive correction value $\epsilon_n$ is generated that is proportional to the phase difference measured between two lines.

if the phase error is decreasing and negative from one line to the next, the frequency of the signal synthesized by crystal oscillator 1 is higher than the nominal frequency. A negative correction value $\epsilon_n$ is generated that is proportional to the phase difference measured between two lines.

if the phase error is constant and strictly positive from one line to the next, the frequency of the signal regenerated by crystal oscillator 1 is equal to the frequency of the reference signal but its phase is incorrect. A positive correction value $\epsilon_n$ is generated corresponding to an elementary shift in order to raise the frequency and recover the correct phase.

If the phase error is constant and strictly negative from one line to the next, the frequency of the signal regenerated by crystal oscillator 1 is equal to the frequency of the reference signal but its phase is incorrect. A negative correction value $\epsilon_n$ is generated that is equal to an elementary shift in order to raise the frequency of the synthesized signal and recover the correct phase.

The dead zone, within which the synthesized signal sent by the crystal oscillator is considered to be correctly locked to the reference signal, is chosen, for example, to correspond to $e_n$ values representative of the phase error between, for example, $-0.8$ and $+0.8$. These values will in practice be determined on a case by case basis according to the needs of users. In the example given here, with 8- or 9-bit encoding, the slave loop will be activated:

as soon as the phase error passes from 0 to $-1$ or from $+1$ to 0; the phase in the present example is correct but the frequency too high, and thus a negative error signal $\epsilon_n$ equal to an elementary shift is generated to lower the frequency.

or as soon as the phase error passes from $-1$ to 0 or from 0 to $+1$; the phase in the present example is correct but the frequency too low, and thus a positive error signal $\epsilon_n$ equal to an elementary shift is generated to raise the frequency.

For 9-bit encoding, with the values chosen as limits for the dead zone, the effective dead zone will correspond to the interval $(-05, +05)$. For 8-bit encoding, the dead zone will only correspond to the value zero.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A process for slaving the frequency and phase of a crystal oscillator with a sequenced reference signal, the crystal oscillator being controlled in frequency and phase by a control signal, the process comprising the steps of:

sampling the reference signal at a sampling frequency substantially equal to that of a clock signal generated by the oscillator, yielding a sampled signal;

digitizing the sampled signal to yield a digitized sampled signal;

deducing from the digitized sampled signal a digital value representative of a phase error between the crystal oscillator and the reference signal for at least one sequence of the reference signal;

generating a correction value from the digital value;

converting the correction value into the control signal; and providing the control signal to the crystal oscillator to control the frequency and phase of the crystal oscillator;

wherein the step of deducing from the digitized sampled signal a digital value includes the steps of determining sampled signal values corresponding to a number of transitions of the sampled signal between two threshold levels and determining a mean value of the sampled signal values.

2. A process as claimed in claim 1 wherein the step of generating a correction value includes the step of generating the correction value according to a magnitude of the phase error and a variation of the phase error from one sequence of the reference signal to another sequence of the reference signal.

3. A process as claimed in claim 1 wherein the step of providing the control signal to the crystal oscillator includes the step of providing a voltage to the crystal oscillator to control the frequency and phase of the crystal oscillator.

4. A process as claimed in claim 1 wherein the step of deducing from the digitized sampled signal a digital value further includes the step of calculating a difference between a mean sample value corresponding to increasing transitions of the sampled signal and a mean sample value corresponding to decreasing transitions of the sampled signal.

5. A process as claimed in claim 1 wherein the step of sampling the reference signal includes the step of sampling the reference signal at a frequency such that substantially a same number of increasing transitions and decreasing transitions of the sampled signal occur for each sequence of the reference signal.

6. A process as claimed in claim 1 wherein the step of generating a correction value includes the step of comparing two digital values and generating a correction value in accordance with the following scheme:

(a) if the phase error is found to be increasing and positive, generating a positive correction value proportional to a difference between the two digital values;

(b) if the phase error is found to be increasing and negative, generating a correction value proportional to the difference between the digital values;

(c) if the phase error is found to be constant and positive, generating a positive correction value; or (d) if the phase error is found to be constant and negative, generating a negative correction value.

7. A process for slaving the frequency and phase of a crystal oscillator with a sequenced reference signal, the crystal oscillator being controlled in frequency and phase by a control signal, the process comprising the steps of:

sampling the reference signal at a sampling frequency substantially equal to that of a clock signal generated by the oscillator, yielding a sampled signal;

digitizing the sampled signal to yield a digitized sampled signal;

deducing from the digitized sampled signal a digital value representative of a phase error between the crystal oscillator and the reference signal for at least one sequence of the reference signal;

generating a correction value from the digital value;

converting the correction value into the control signal;

providing the control signal to the crystal oscillator to control the frequency and phase of the crystal oscillator; and further including the step of determining a dead zone corresponding to values representative of the phase error for which the control signal is not provided to the crystal oscillator.

8. A device for slaving the frequency and phase of a crystal oscillator with a reference signal, the crystal oscillator being controlled in frequency and phase by a control signal, comprising:

an analog-to-digital converter sampling the reference signal at a sampling frequency substantially equal to that of a clock signal generated by the crystal oscillator, to yield a sampled signal;

means, coupled to the analog-to-digital converter, for digitally calculating values representative of a phase error between the crystal oscillator and the reference signal;

means, coupled to the means for digitally calculating, for generating a correction value from the values representative of the phase error; and a digital-to-analog integrator, coupled to the means for generating and to the crystal oscillator, converting the correction value into the control signal and applying the control signal to the crystal oscillator;

wherein the means for digitally calculating includes:
means for detecting transitions between threshold levels of the sampled signal;

memory registers, coupled to the means for detecting, storing samples corresponding to detected transitions; and means, coupled to the registers, for determining a mean value of the stored samples.

9. A device as claimed in claim 8 wherein the means for detecting includes at least one increasing transition detector and at least one decreasing transition detector.

10. A device as claimed in claim 9 wherein the means for determining includes means for determining the mean value of increasing transition samples and the mean value of decreasing transition samples, and the difference between the mean value of increasing transition samples and the mean value of decreasing transition samples.

11. A device for slaving the frequency and phase of a crystal oscillator with a reference signal, comprising:

an analog-to-digital converter, receiving the reference signal and sampling the reference signal at a sampling frequency proportional to a frequency of the crystal oscillator;

a digital circuit, coupled to the analog-to-digital converter, calculating values representative of a phase error between the reference signal and the oscillator;

a correction circuit, coupled to the digital circuit, receiving the values representative of the phase error, and calculating a correction value; and an integrator, coupled to the correction circuit, receiving the correction value, converting the correction value into a control signal and providing the control signal to the crystal oscillator to control the frequency and phase of the crystal oscillator;

wherein the digital circuit includes a level detector circuit, coupled to the analog-to-digital converter, receiving a sampled signal from the analog-to-digital converter and determining the magnitude of the sampled signal.

12. A device as claimed in claim 11 wherein the digital circuit further includes a transition detector, coupled to the level detector, determining transitions of the sampled signal between two threshold levels.

13. A device as claimed in claim 12 wherein the digital circuit further includes an ascending sample memory register and a descending sample memory register, both sample memory registers coupled to the transition detector, the ascending sample memory register storing the samples corresponding to ascending transitions detected by the transition detector and the descending sample memory register storing samples corresponding to descending transitions detected by the transition detector.

14. A device as claimed in claim 13 wherein the digital circuit further includes an averaging circuit, coupled to both the ascending sample memory register and the descending sample memory register for calculating a mean value of the samples stored in the ascending and descending sample memory registers.

15. A device as claimed in claim 14 wherein the correction circuit includes a delay element and an algorithm circuit, connected in series and coupled to the averaging circuit, receiving the mean value from the averaging circuit, and generating the correction value.

* * * * *